(12) United States Patent
Lee et al.

(10) Patent No.: US 11,257,795 B2
(45) Date of Patent: Feb. 22, 2022

(54) CHIP-SCALE LED PACKAGE STRUCTURE

(71) Applicants: LITE-ON OPTO TECHNOLOGY (CHANGZHOU) CO., LTD., Jiangsu Province (CN); LITE-ON TECHNOLOGY CORPORATION, Taipei (TW)

(72) Inventors: Tien-Yu Lee, Taipei (TW); Chih-Yuan Chen, New Taipei (TW); Wei-Lun Tsai, New Taipei (TW); Chien-Tung Huang, New Taipei (TW); Wei-Hsun Hsu, Taoyuan (TW); Wei-Chien Hung, Taipei (TW)

(73) Assignees: LITE-ON OPTO TECHNOLOGY (CHANGZHOU) CO., LTD., Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/718,247

(22) Filed: Dec. 18, 2019

(65) Prior Publication Data
US 2020/0235079 A1 Jul. 23, 2020

(30) Foreign Application Priority Data
Jan. 21, 2019 (CN) .......................... 201910055333.7

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/502* (2013.01); *H01L 33/56* (2013.01); *H01L 33/58* (2013.01)

(58) Field of Classification Search
CPC ... H01L 25/0753; H01L 33/502; H01L 33/58; H01L 33/56
See application file for complete search history.

(56) References Cited

U.S. PATENT DOCUMENTS

2005/0253130 A1* 11/2005 Tsutsumi ............... H05B 33/20 257/13
2011/0180818 A1* 7/2011 Lerman ............... H01L 25/0753 257/88

(Continued)

FOREIGN PATENT DOCUMENTS

| CN | 101331357 A | 12/2008 |
|---|---|---|
| CN | 101937911 A | 1/2011 |

(Continued)

*Primary Examiner* — Jay C Chang
*Assistant Examiner* — Mikka Liu
(74) *Attorney, Agent, or Firm* — Li & Cai Intellectual Property (USA) Office

(57) ABSTRACT

A chip-scale LED package structure includes a white light emitting unit for emitting a white light, a red flip-chip LED for emitting a red light, a green flip-chip LED for emitting a green light, a blue flip-chip LED for emitting a blue light, and an encapsulation layer. The encapsulation includes an encapsulation resin and a plurality of refractive particles distributed in the encapsulation resin. The encapsulation layer encapsulates the white light emitting unit, the red flip-chip LED, the green flip-chip LED, and the blue flip-chip LED. Moreover, electrodes of the white light emitting unit, electrodes of the red flip-chip LED, electrodes of the green flip-chip LED, and electrodes of the blue flip-chip LED are exposed from the encapsulation layer.

20 Claims, 10 Drawing Sheets

(51) Int. Cl.
*H01L 33/58* (2010.01)
*H01L 33/56* (2010.01)

(56) References Cited

U.S. PATENT DOCUMENTS

| | | | |
|---|---|---|---|
| 2014/0042415 A1* | 2/2014 | Park | H01L 51/5275 257/40 |
| 2018/0103513 A1* | 4/2018 | Tseng | H01L 25/0753 |
| 2018/0175255 A1* | 6/2018 | Morikawa | H01L 33/508 |
| 2018/0294388 A1 | 10/2018 | Hung et al. | |

FOREIGN PATENT DOCUMENTS

| | | |
|---|---|---|
| CN | 106129231 A | 11/2016 |
| CN | 108028303 A | 5/2018 |

\* cited by examiner

US 11,257,795 B2

CHIP-SCALE LED PACKAGE STRUCTURE

CROSS-REFERENCE TO RELATED PATENT APPLICATION

This application claims the benefit of priority to Patent Application No. 201910055333.7, filed on Jan. 21, 2019 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an LED package structure, and more particularly to a chip-scale LED package structure.

BACKGROUND OF THE DISCLOSURE

A conventional LED package structure is formed by mounting a plurality of light-emitting chips onto a substrate, and the conventional LED package structure can emit a white light by mixing lights emitted from the light-emitting chips. However, since the conventional LED package structure needs to undergo a die-bonding process and a wire-bonding process on the substrate, issues relating to reliability or defects may result therefrom.

SUMMARY OF THE DISCLOSURE

In response to the above-referenced technical inadequacies, the present disclosure provides a chip-scale LED package structure to effectively improve the issues associated with conventional LED package structures.

In one aspect, the present disclosure provides a chip-scale LED package structure, which includes a white light emitting unit for emitting a white light, a red flip-chip LED for emitting a red light, a green flip-chip LED for emitting a green light, a blue flip-chip LED for emitting a blue light, and an encapsulation layer. The encapsulation layer includes an encapsulation resin and a plurality of refractive particles distributed in the encapsulation resin. The encapsulation layer encapsulates the white light emitting unit, the red flip-chip LED, the green flip-chip LED, and the blue flip-chip LED. Moreover, electrodes of the white light emitting unit, electrodes of the red flip-chip LED, electrodes of the green flip-chip LED, and electrodes of the blue flip-chip LED are exposed from the encapsulation layer.

Therefore, the chip-scale LED package structure of the present disclosure is formed by encapsulating the white light emitting unit, the red flip-chip LED, the green flip-chip LED, and the blue flip-chip LED into the encapsulation layer and exposing the electrodes of each of the white light emitting unit, the red flip-chip LED, the green flip-chip LED, and the blue flip-chip LED from the encapsulation layer, so that issues relating to reliability or defects resulting from the die-bonding process and the wire-bonding process can be effectively improved, and the size of the LED package structure can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
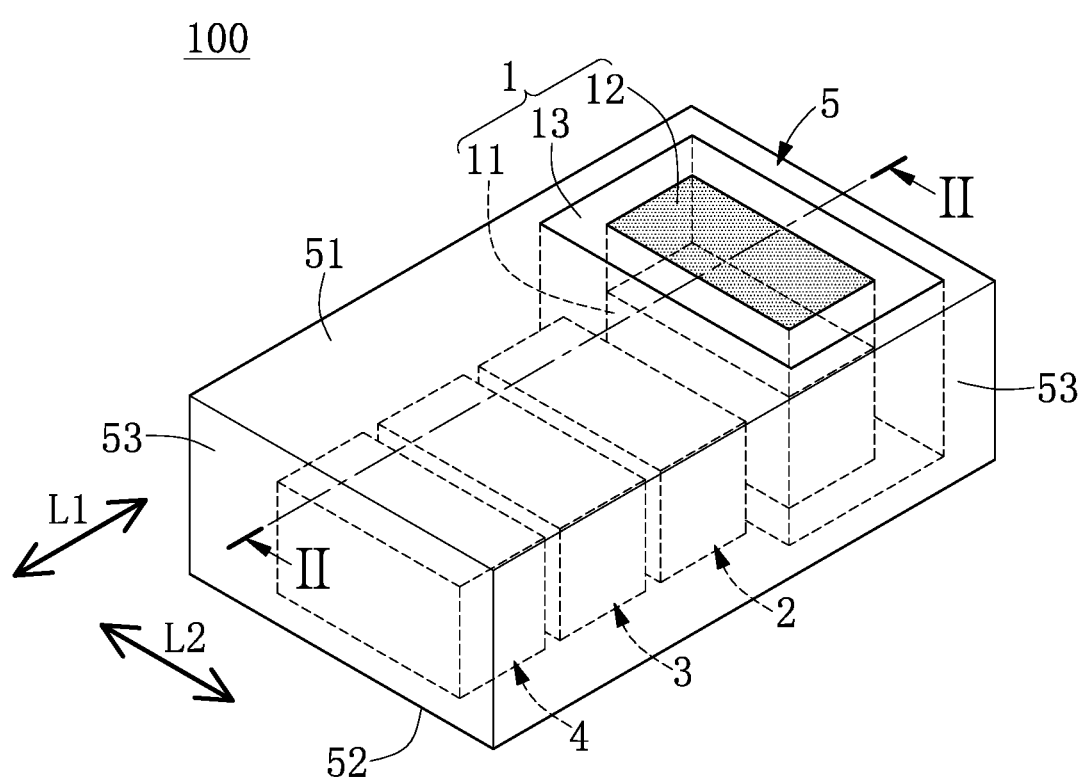
FIG. 1 is a perspective view of a chip-scale LED package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
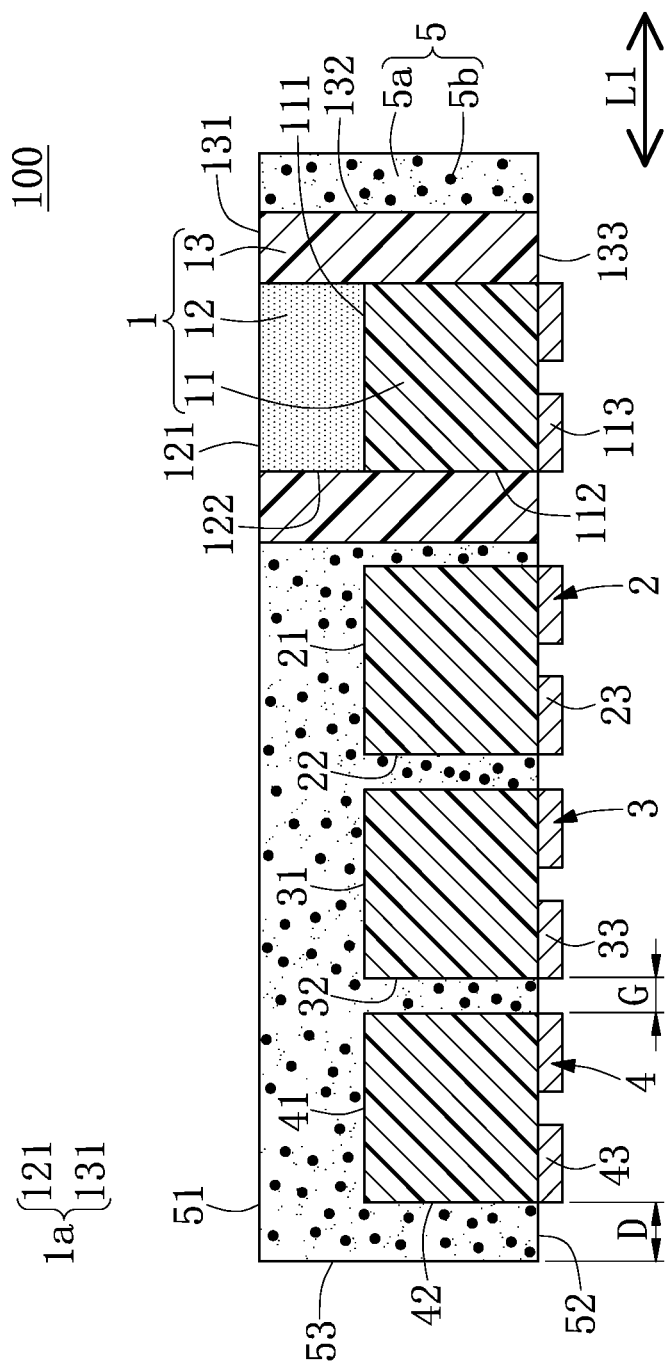
FIG. 2 is a cross-sectional view taken along line II-II of FIG. 1.
Figure 3:
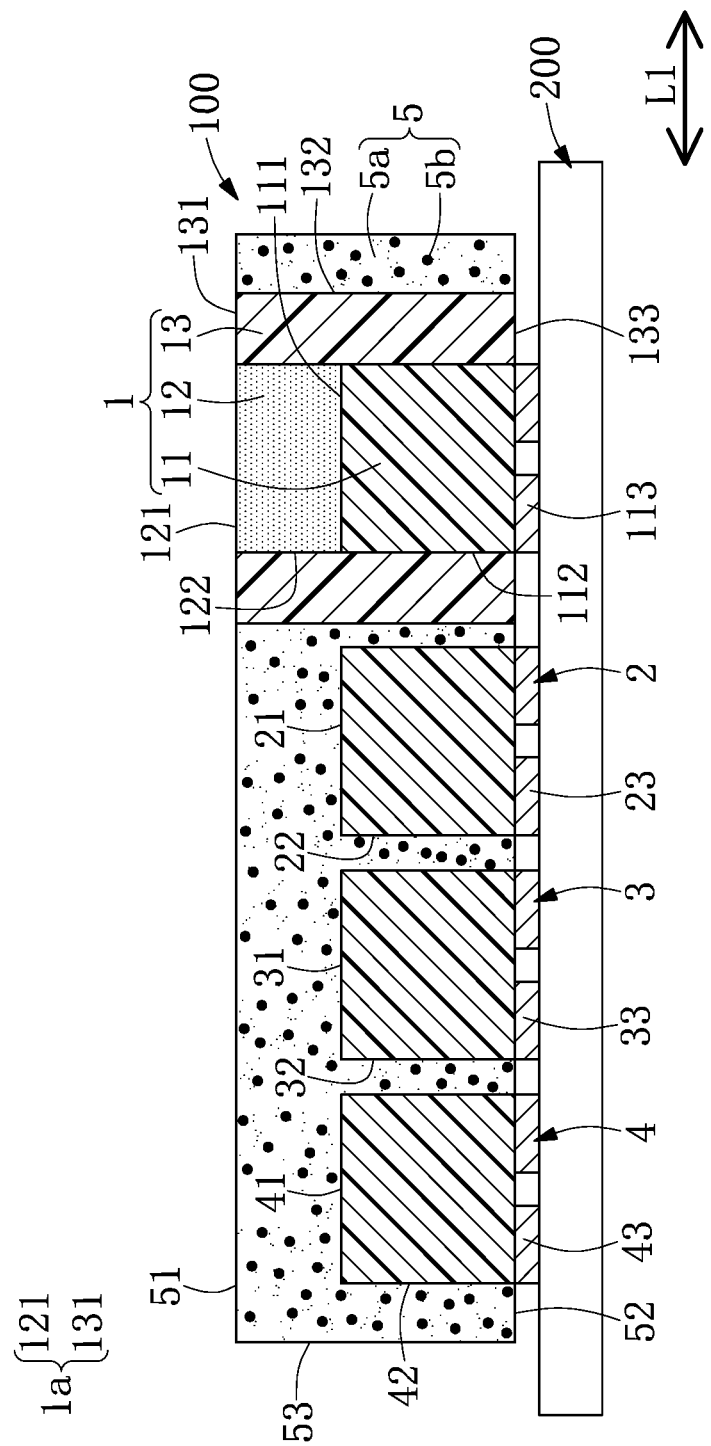
FIG. 3 is a cross-sectional view showing the chip-scale LED package structure mounted on a carrier according to the first embodiment of the present disclosure.
Figure 4:
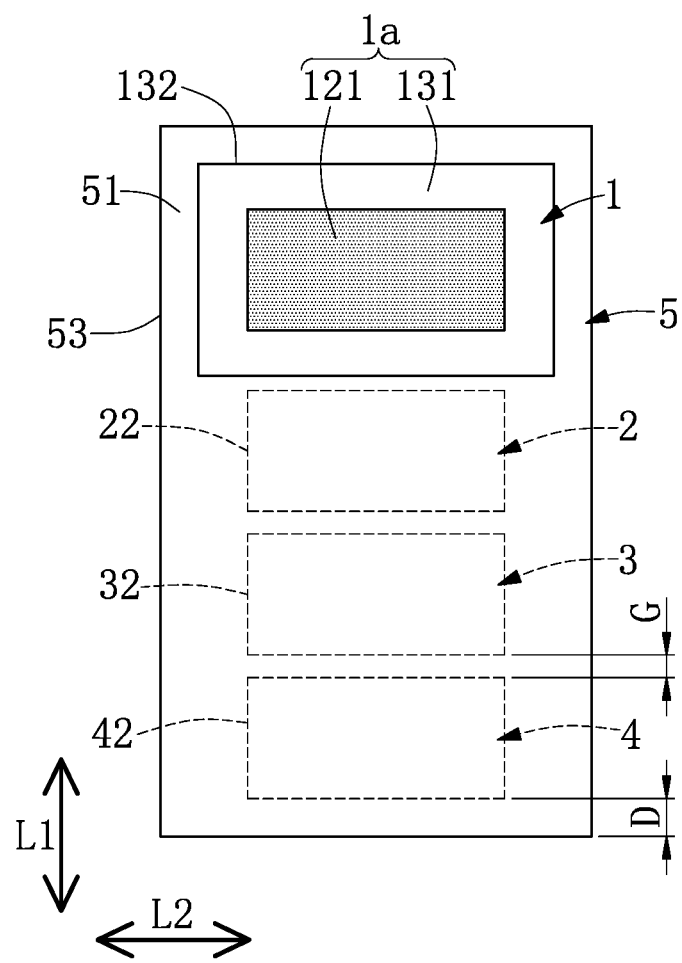
FIG. 4 is a top view of FIG. 1.

Referring to FIG. 1 to FIG. 6, a first embodiment of the present disclosure provides a chip-scale LED package structure 100. As shown in FIG. 2 to FIG. 4, the chip-scale LED package structure 100 in the present embodiment is substantially a cuboid structure. A longitudinal direction of the chip-scale LED package structure 100 is defined as a first direction L1, and a width direction of the chip-scale LED package structure 100 is defined as a second direction L2.

The chip-scale LED package structure 100 includes a white light emitting unit 1 for emitting a white light, a red flip-chip LED 2 for emitting a red light, a green flip-chip LED 3 for emitting a green light, a blue flip-chip LED 4 for emitting a blue light, and an encapsulation layer 5. The white light emitting unit 1 in the present embodiment can emit white light that is similar to light emitted from a fluorescent lamp.

As shown in FIG. 2 to FIG. 4, the white light emitting unit 1 is in an elongated shape (e.g., a substantially rectangular shape), and includes an inner LED chip 11, a phosphor sheet 12, and a surrounding wall 13. The inner LED chip 11 is substantially a cuboid structure, and includes a top surface 111, four lateral surfaces 112 connected to peripheral edges of the top surface 111, and a plurality of electrodes 113 arranged on a bottom thereof.

The phosphor sheet 12 is substantially a rectangular sheet, and is stacked onto the top surface 111 of the inner LED chip 11. The phosphor sheet 12 has an outer surface 121 and four lateral surfaces 122 connected to peripheral edges of the outer surface 121. The four lateral surfaces 112 of the inner LED chip 11 in the present embodiment are substantially flush with the four lateral surfaces 122 of the phosphor sheet 12, respectively.

Specifically, a thickness of the phosphor sheet 12 in the present embodiment can be within a range of 40 μm to 60 μm, and a color rendering index (CRI) of the phosphor sheet 12 can be adjusted or changed according to design requirements. Accordingly, light emitted from the inner LED chip 11 can be converted to white light by passing through the phosphor sheet 12, and the CRI and the color temperature of the white light can be adjusted through the phosphor sheet 12.

The surrounding wall 13 is disposed around the four lateral surfaces 112 of the inner LED chip 11 and the four lateral surfaces 122 of the phosphor sheet 12. The electrodes 113 of the inner LED chip 11 are exposed from the surrounding wall 13. In other words, the electrodes 113 of the inner LED chip 11 protrude from a bottom surface 133 of the surrounding wall 13 that is substantially coplanar with a bottom side of the encapsulation layer 5. Moreover, a top surface 131 of the surrounding wall 13 and the outer surface 121 of the phosphor sheet 12 jointly define a top surface 1a of the white light emitting unit 1, and the top surface 131 of the surrounding wall 13 is preferably coplanar with the outer surface 121 of the phosphor sheet 12. Four lateral surfaces of the surrounding wall 13 in the present embodiment are the four lateral surfaces 132 of the white light emitting unit 1, respectively.

Specifically, the surrounding wall 13 in the present embodiment is preferably made of a white silica gel having a reflectivity of at least 80%, so that a portion of light emitted from the inner LED chip 11 can pass through the phosphor 12 by being reflected from the surrounding wall 13. Accordingly, a forward illuminance of the white light emitting unit 1 can be effectively increased by 10% to 20%. A light-emitting angle of the white light emitting unit 1 in the present embodiment is substantially 120 degrees, but the present disclosure is not limited thereto. For example, the inner LED chip 11 of the white light emitting unit 1 can be a blue LED chip, and the phosphor sheet 12 of the white light emitting unit 1 can be a yellow phosphor sheet. Or, the inner LED chip 11 of the white light emitting unit 1 can be an ultraviolet LED chip, and the phosphor sheet 12 of the white light emitting unit 1 can be a red-green-blue phosphor sheet.

As shown in FIG. 2 and FIG. 4, each of the red Flip-chip LED 2, the green Flip-chip LED 3, and the blue Flip-chip LED 4 is in an elongated shape (e.g., a substantially rectangular shape). Each of the red Flip-chip LED 2, the green Flip-chip LED 3, and the blue Flip-chip LED 4 has a top surface 21, 31, 41, four lateral surfaces 22, 32, 42 connected to peripheral edges of the top surface 21, 31, 41, and a plurality of electrodes 23, 33, 43 arranged on a bottom thereof. Moreover, as shown in FIG. 3, the chip-scale LED package structure 100 can be soldered and fixed onto a carrier 200 through the electrodes 113, 23, 33, 43, thereby establishing an electrical connection there-between. In addition, the carrier 200 can be a printed circuit board or a flexible circuit board.

As shown in FIG. 2 and FIG. 4, the encapsulation layer 5 encapsulates the white light emitting unit 1, the red Flip-chip LED 2, the green Flip-chip LED 3, and the blue Flip-chip LED 4. Specifically, the top surface 21, 31, 41 and the four lateral surfaces 22, 32, 42 of each of the red Flip-chip LED 2, the green Flip-chip LED 3, and the blue Flip-chip LED 4 are covered by the encapsulation layer 5. The top surface 1a of the white light emitting unit 1 is coplanar with a top surface 51 of the encapsulation layer 5, and at least one of the four lateral surfaces 132 of the white light emitting unit 1 is covered by the encapsulation layer 5.

Figure 5:
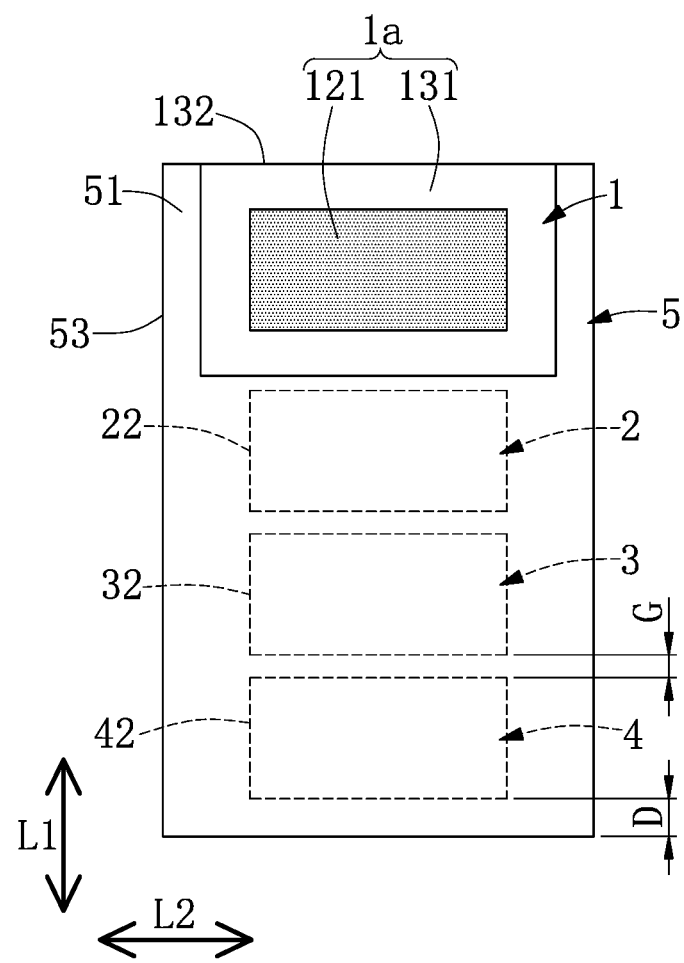
FIG. 5 is a top view showing the chip-scale LED package structure in another configuration according to the first embodiment of the present disclosure.
Figure 6:
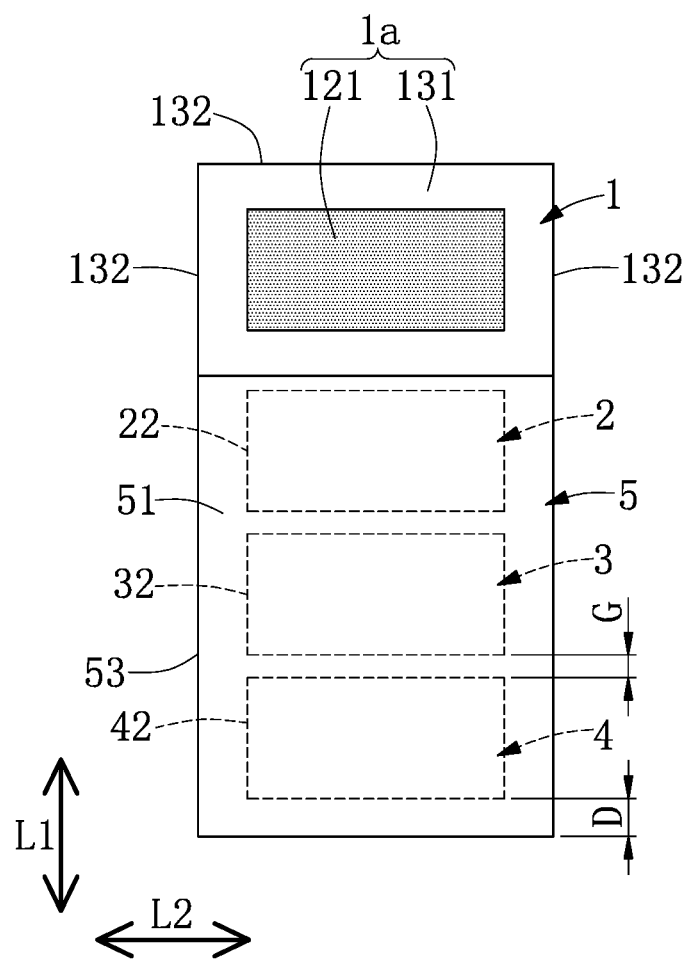
FIG. 6 is a top view showing the chip-scale LED package structure in still another configuration according to the first embodiment of the present disclosure.
Figure 7:
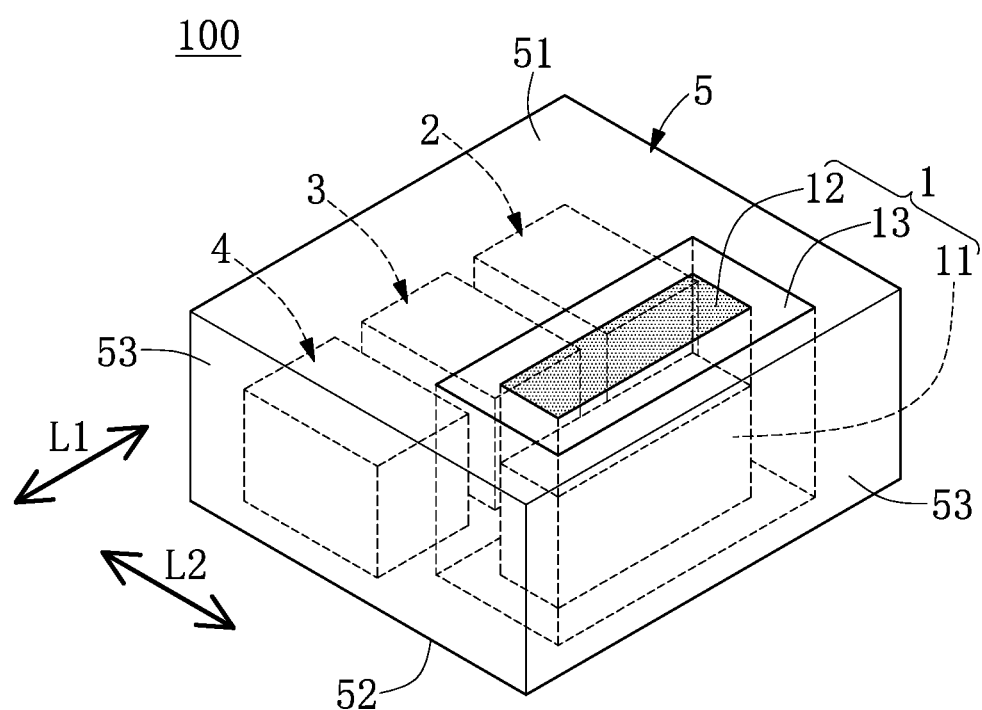
FIG. 7 is a perspective view of a chip-scale LED package structure according to a second embodiment of the present disclosure.

For example, as shown in FIG. 2, an entirety of the four lateral surfaces 132 of the white light emitting unit 1 can be covered by the encapsulation layer 5. As shown in FIG. 5, three of the four lateral surfaces 132 of the white light emitting unit 1 can be covered by the encapsulation layer 5, and the other one of the four lateral surfaces 132 of the white light emitting unit 1 arranged away from the red Flip-chip LED 2 is exposed from the encapsulation layer 5. As shown in FIG. 6, three of the four lateral surfaces 132 of the white light emitting unit 1 can be exposed from the encapsulation layer 5, and the other one of the four lateral surfaces 132 of the white light emitting unit 1 arranged adjacent to the red Flip-chip LED 2 is covered by the encapsulation layer 5. According to FIG. 5 and FIG. 6, at least one of the lateral surfaces 132 of the surrounding wall 13 (or the white light emitting unit 1) is coplanar with an adjacent portion of an outer side surface 53 of the encapsulation layer 5.

As shown in FIG. 2 and FIG. 4, the electrodes 113 of the white light emitting unit 1, the electrodes 23 of the red flip-chip LED 2, the electrodes 33 of the green flip-chip LED 3, and the electrodes 43 of the blue flip-chip LED 4 are exposed from the encapsulation layer 5 or protrude from a bottom surface 52 of the encapsulation layer 5. In other words, the bottom surface 133 of the surrounding wall 13 in the present embodiment is exposed from the encapsulation layer 5.

It should be noted that the encapsulation layer 5 in the present embodiment includes an encapsulation resin 5a and a plurality of refractive particles 5b distributed in the encapsulation resin 5a. The material of the encapsulation resin 5a is preferably a silica gel having a high refractive index (e.g., the high refractive index is 1.5), so as to increase the lighting performance of the chip-scale LED package structure 100. Moreover, a weight percentage of the refractive particles 5b relative to the encapsulation layer 5 is within a range of 3 wt % to 30 wt %, and the refractive particles 5b includes a plurality of silica nanoparticles or/and a plurality of titanium dioxide nanoparticles, thereby increasing the uniformity of light emitted from the chip-scale LED package structure 100, but the present disclosure is not limited thereto.

The above description describes structural features of each component of the chip-scale LED package structure 100, and the following description describes connection relationships of each component of the chip-scale LED package structure 100 (e.g., arrangement and distance between the components of the chip-scale LED package structure 100).

As shown in FIG. 2 and FIG. 4, the white light emitting unit 1, the red flip-chip LED 2, the green flip-chip LED 3, and the blue flip-chip LED 4 are (sequentially) arranged in one row along the first direction L1. That is to say, the white light emitting unit 1 and the blue flip-chip LED 4 are arranged at two opposite outer sides of the red flip-chip LED 2 and the green flip-chip LED 3, respectively.

Moreover, the red flip-chip LED 2, the green flip-chip LED 3, and the blue flip-chip LED 4 in the present embodiment are arranged adjacent to each other. Any two of the red flip-chip LED 2, the green flip-chip LED 3, and the blue flip-chip LED 4 adjacent to each other have an interval G within a range of 10 µm to 50 µm, but the present disclosure is not limited thereto.

Specifically, a longitudinal direction of the white light emitting unit 1 is parallel to that of each of the red flip-chip LED 2, the green flip-chip LED 3, and the blue flip-chip LED 4, and is perpendicular to the first direction L1 (i.e., the longitudinal direction is parallel to the second direction L2). In the present embodiment, one of the four lateral surfaces 32 of the green flip-chip LED 3 and adjacent one of the four lateral surfaces 22 of the red flip-chip LED 2 are coplanar with each other and parallel to the first direction L1. The two lateral surfaces 32, 22 of the green flip-chip LED 3 and the red flip-chip LED 2 also coplanar with the lateral surface 42 of the blue flip-chip LED 2 and parallel to the first direction. In other words, the red flip-chip LED 2, the green flip-chip LED 3, and the blue flip-chip LED 4 in the present embodiment have the same size, and the red flip-chip LED 2 and the blue flip-chip LED 4 are mirror-symmetrical with respect to the green flip-chip LED 3.

In addition, a minimum distance D between the outer side surface 53 of the encapsulation layer 5 and any one of the red flip-chip LED 2, the green flip-chip LED 3, and the blue flip-chip LED 4 is within a range of 25 µm to 180 µm, so that the luminous efficiency of the chip-scale LED package structure 100 can avoid being reduced.

Second Embodiment

Referring to FIG. 7 to FIG. 11, a second embodiment of the present disclosure is similar to the first embodiment of the present disclosure, so that the descriptions of the same components in the first and second embodiments of the present disclosure will be omitted for the sake of brevity, and the following description only discloses different features between the first and second embodiments.

Figure 8:
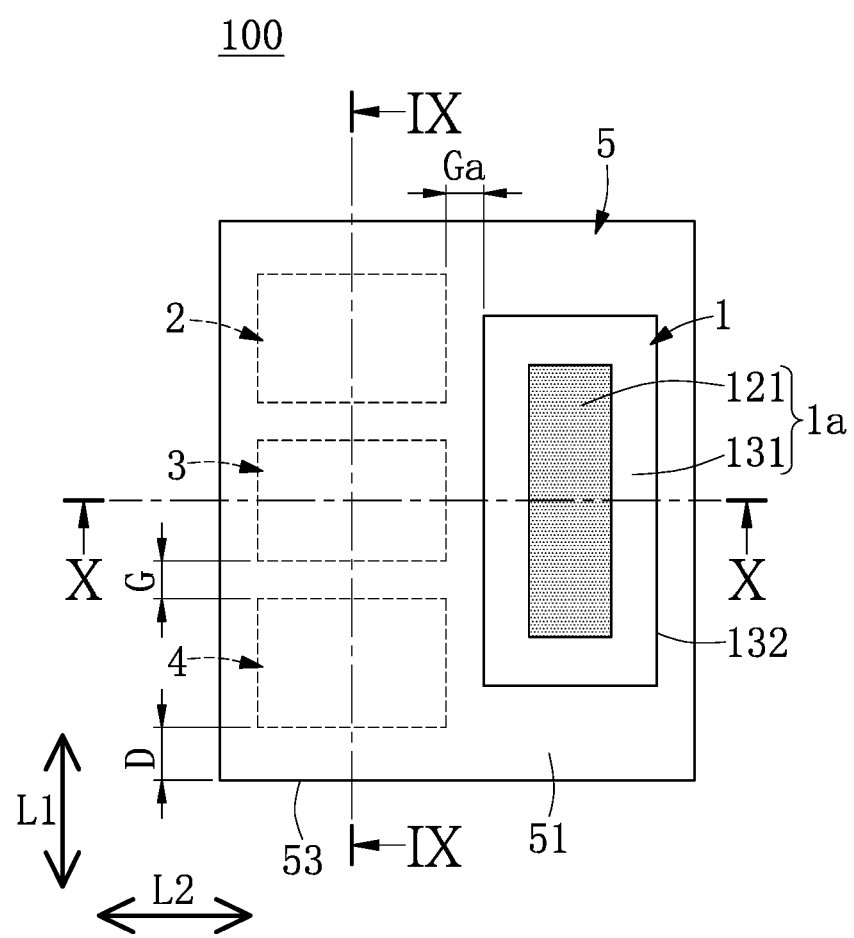
FIG. 8 is a top view of FIG. 7.
Figure 9:
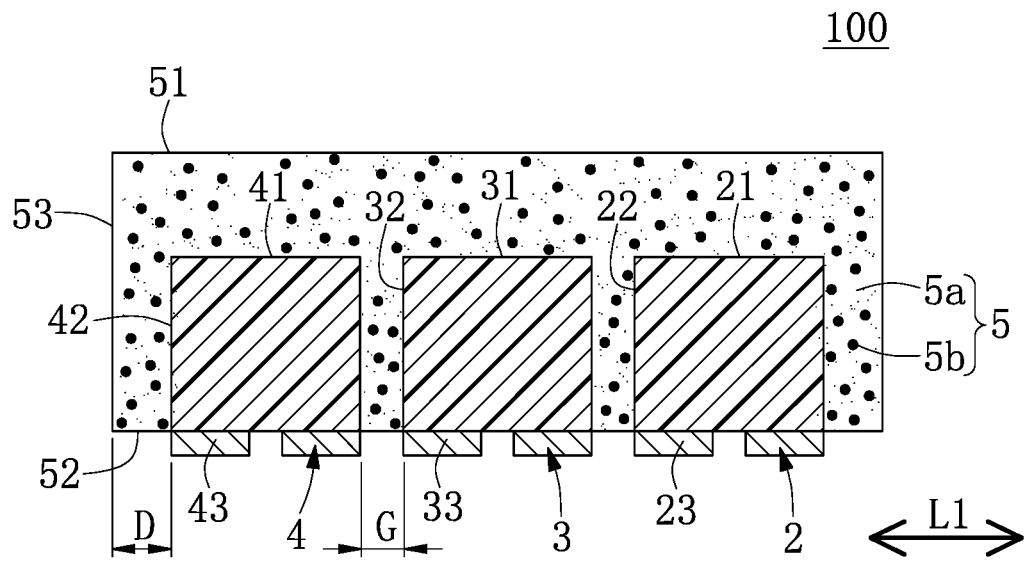
FIG. 9 is a cross-sectional view taken along line IX-IX of FIG. 8.
Figure 10:
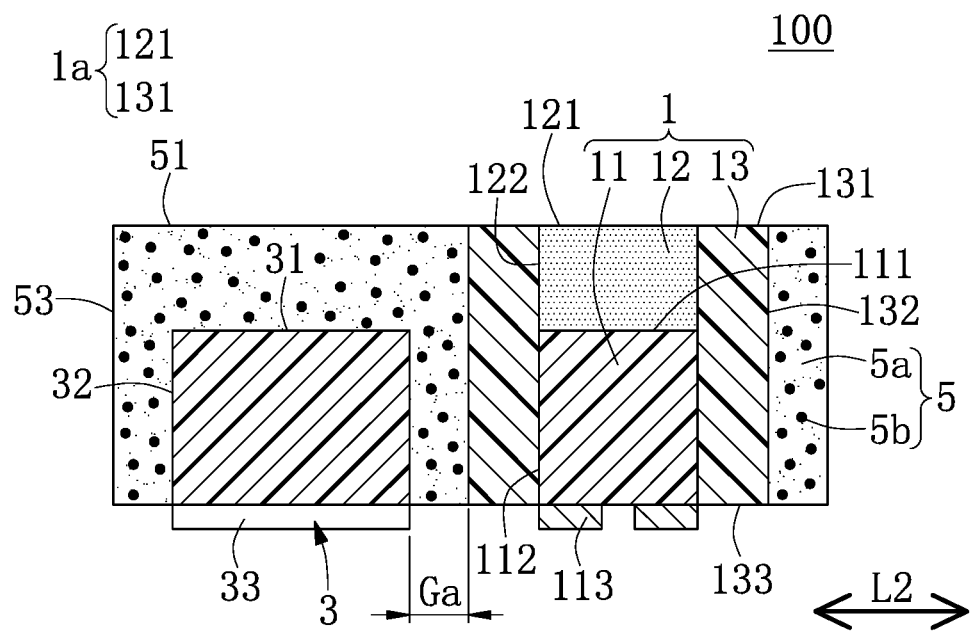
FIG. 10 is a cross-sectional view taken along line X-X of FIG. 8.
Figure 11:
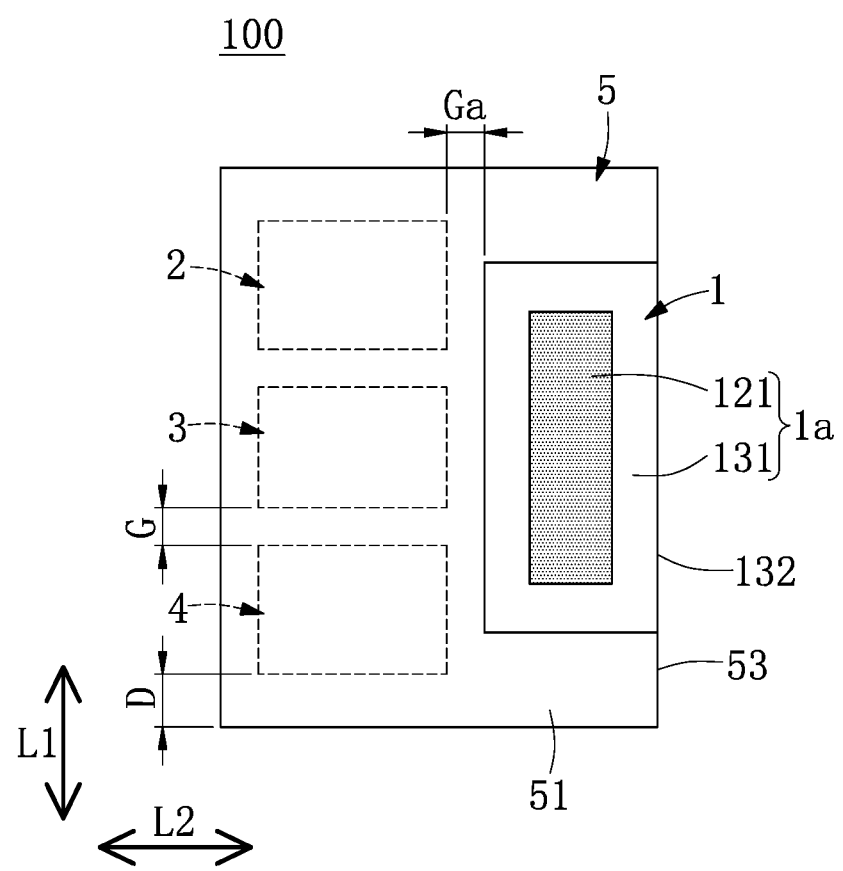
FIG. 11 is a top view showing the chip-scale LED package structure in another configuration according to the second embodiment of the present disclosure.

As shown in FIG. 8 and FIG. 11 of the present embodiment, the red flip-chip LED 2, the green flip-chip LED 3, and the blue flip-chip LED 4 are (sequentially) arranged in one row along the first direction L1, and are arranged adjacent to each other. Moreover, the white light emitting unit 1 is arranged at the same side of the red flip-chip LED 2, the green flip-chip LED 3, and the blue flip-chip LED 4, and has the same interval Ga with respect to any one of the red flip-chip LED 2, the green flip-chip LED 3, and the blue flip-chip LED 4.

In other words, a longitudinal direction of the white light emitting unit 1 is perpendicular to that of each of the red flip-chip LED 2, the green flip-chip LED 3, and the blue flip-chip LED 4, and is parallel to the first direction L1.

In addition, the four lateral surfaces 132 of the white light emitting unit 1 shown in FIG. 8 are covered by the encapsulation layer 5, but the present disclosure is not limited thereto. For example, as shown in FIG. 11, three of the four lateral surfaces 132 of the white light emitting unit 1 can be covered by the encapsulation layer 5, and the other one of the four lateral surfaces 132 of the white light emitting unit 1 arranged away from the green flip-chip LED 3 is exposed from the encapsulation layer 5 and is coplanar with an adjacent portion of the outer side surface 53 of the encapsulation layer 5.

Furthermore, in other embodiments of the present disclosure, the top surface of the chip-scale LED package structure can have a substantially square shape; or the top surface of the chip-scale LED package structure can have a rectangular shape that has two short edges parallel to the first direction L1 and two long edges parallel to the second direction L2.

In conclusion, the chip-scale LED package structure of the present disclosure is formed by encapsulating the white light emitting unit, the red flip-chip LED, the green flip-chip LED, and the blue flip-chip LED into the encapsulation layer and exposing the electrodes of each of the white light emitting unit, the red flip-chip LED, the green flip-chip LED, and the blue flip-chip LED from the encapsulation layer, so that issues relating to reliability and defects resulting from the die-bonding process and the wire-bonding process can be effectively improved, and the size of the chip-scale LED package structure can be reduced.

Moreover, the chip-scale LED package structure of the present disclosure can be formed with at least one lateral surface of the white light emitting unit (or the surrounding wall) that is coplanar with an adjacent portion of the outer side surface of the encapsulation layer, so that the size of the chip-scale LED package structure can be further reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip-scale light emitting diode (LED) package structure, comprising:
   a white light emitting unit configured to emit a white light;
   a red flip-chip LED configured to emit a red light;
   a green flip-chip LED configured to emit a green light;
   a blue flip-chip LED configured to emit a blue light; and
   an encapsulation layer including an encapsulation resin and a plurality of refractive particles distributed in the encapsulation resin, wherein the encapsulation layer encapsulates the white light emitting unit, the red flip-chip LED, the green flip-chip LED, and the blue flip-chip LED, and
   wherein electrodes of the white light emitting unit, electrodes of the red flip-chip LED, electrodes of the green flip-chip LED, and electrodes of the blue flip-chip LED are exposed from the encapsulation layer.

2. The chip-scale LED package structure according to claim 1, wherein each of the red flip-chip LED, the green flip-chip LED, and the blue flip-chip LED has a top surface covered by the encapsulation layer and four lateral surfaces covered by the encapsulation layer.

3. The chip-scale LED package structure according to claim 2, wherein the four lateral surfaces of the white light emitting unit are covered by the encapsulation layer.

4. The chip-scale LED package structure according to claim 2, wherein three of the four lateral surfaces of the white light emitting unit is covered by the encapsulation layer, and the other one of the four lateral surfaces of the white light emitting unit arranged away from the red flip-chip LED is exposed from the encapsulation layer.

5. The chip-scale LED package structure according to claim 2, wherein three of the four lateral surfaces of the white light emitting unit is exposed from the encapsulation layer, and the other one of the four lateral surfaces of the white light emitting unit arranged adjacent to the red flip-chip LED is covered by the encapsulation layer.

6. The chip-scale LED package structure according to claim 1, wherein the white light emitting unit, the red flip-chip LED, the green flip-chip LED, and the blue flip-chip LED are arranged in one row along a first direction, wherein the red flip-chip LED, the green flip-chip LED, and the blue flip-chip LED are arranged adjacent to each other, and wherein the white light emitting unit and the blue flip-chip LED are arranged at two opposite outer sides of the red flip-chip LED and the green flip-chip LED, respectively.

7. The chip-scale LED package structure according to claim 6, wherein each of the white light emitting unit, the red flip-chip LED, the green flip-chip LED, and the blue flip-chip LED is in a rectangular shape, and wherein a longitudinal direction of the white light emitting unit is parallel to that of each of the red flip-chip LED, the green flip-chip LED, and the blue flip-chip LED, and is perpendicular to the first direction.

8. The chip-scale LED package structure according to claim 6, wherein the white light emitting unit, the red flip-chip LED, the green flip-chip LED, and the blue flip-chip LED are sequentially arranged in one row along the first direction.

9. The chip-scale LED package structure according to claim 1, wherein the red flip-chip LED, the green flip-chip LED, and the blue flip-chip LED are arranged in one row along a first direction and are arranged adjacent to each other, and wherein the white light emitting unit is arranged side by side with the red flip-chip LED, the green flip-chip LED, and the blue flip-chip LED, and has the same interval with respect to any one of the red flip-chip LED, the green flip-chip LED, and the blue flip-chip LED.

10. The chip-scale LED package structure according to claim 9, wherein each of the white light emitting unit, the red flip-chip LED, the green flip-chip LED, and the blue flip-chip LED is in an elongated shape, and wherein a longitudinal direction of the white light emitting unit is perpendicular to that of each of the red flip-chip LED, the green flip-chip LED, and the blue flip-chip LED, and is parallel to the first direction.

11. The chip-scale LED package structure according to claim 10, wherein the white light emitting unit has a top surface and four lateral surfaces, the top surface of the white light emitting unit is coplanar with a top surface of the encapsulation layer, and the four lateral surfaces of the white light emitting unit are covered by the encapsulation layer.

12. The chip-scale LED package structure according to claim 10, wherein the white light emitting unit has a top surface and four lateral surfaces, wherein the top surface of the white light emitting unit is coplanar with a top surface of the encapsulation layer, and wherein three of the four lateral surfaces of the white light emitting unit is covered by the encapsulation layer, and the other one of the four lateral surfaces of the white light emitting unit arranged away from the green flip-chip LED is exposed from the encapsulation layer and is coplanar with an adjacent portion of an outer side surface of the encapsulation layer.

13. The chip-scale LED package structure according to claim 1, wherein the refractive particles include a plurality of silica nanoparticles or/and a plurality of titanium dioxide nanoparticles, and a weight percentage of the refractive particles relative to the encapsulation layer is within a range of 3 weight percentage (wt %) to 30 wt %.

14. The chip-scale LED package structure according to claim 1, wherein any two of the red flip-chip LED, the green flip-chip LED, and the blue flip-chip LED adjacent to each other have an interval within a range of 10 μm to 50 μm.

15. The chip-scale LED package structure according to claim 1, wherein a minimum distance between an outer side surface of the encapsulation layer and any one of the red flip-chip LED, the green flip-chip LED, and the blue flip-chip LED is within a range of 25 μm to 180 μm.

16. The chip-scale LED package structure according to claim 1, wherein the white light emitting unit further includes:
   an inner LED chip having a top surface and four lateral surfaces;
   a phosphor sheet having an outer surface and four lateral surfaces and stacked onto the top surface of the inner LED chip, wherein the four lateral surfaces of the inner LED chip are substantially flush with the four lateral surfaces of the phosphor sheet, respectively; and
   a surrounding wall disposed onto the four lateral surfaces of the inner LED chip and the four lateral surfaces of the phosphor sheet,
   wherein a bottom surface of the surrounding wall is exposed from the encapsulation layer, and the outer surface of the phosphor sheet and a top surface of the surrounding wall jointly define a top surface of the white light emitting unit.

17. The chip-scale LED package structure according to claim 16, wherein the top surface of the white light emitting unit is coplanar with a top surface of the encapsulation layer.

18. The chip-scale LED package structure according to claim 16, wherein at least one lateral surface of the surrounding wall is coplanar with an adjacent portion of an outer side surface of the encapsulation layer.

19. The chip-scale LED package structure according to claim 16, wherein at least two lateral surfaces of the surrounding wall are coplanar with an adjacent portion of an outer side surface of the encapsulation layer.

20. The chip-scale LED package structure according to claim 1, wherein the white light emitting unit has a top surface and four lateral surfaces, the top surface of the white light emitting unit is coplanar with a top surface of the encapsulation layer, and at least one of the four lateral surfaces of the white light emitting unit is covered by the encapsulation layer.

\* \* \* \* \*

UNITED STATES PATENT AND TRADEMARK OFFICE
CERTIFICATE OF CORRECTION

PATENT NO. : 11,257,795 B2  
APPLICATION NO. : 16/718247  
DATED : February 22, 2022  
INVENTOR(S) : Tien-Yu Lee et al.

Page 1 of 1

It is certified that error appears in the above-identified patent and that said Letters Patent is hereby corrected as shown below:

On the Title Page

Item (71), the address of the Applicant, LITE-ON OPTO TECHNOLOGY (CHANGZHOU) CO., LTD., reading -JIANGSU PROVINCE (CN)- should read --CHANGZHOU CITY, JIANGSU PROVINCE (CN)--

Item (73), the address of the Assignee, LITE-ON OPTO TECHNOLOGY (CHANGZHOU) CO., LTD., reading -JIANGSU PROVINCE (CN)- should read --CHANGZHOU CITY, JIANGSU PROVINCE (CN)--

Signed and Sealed this  
Fifth Day of March, 2024

Katherine Kelly Vidal  
*Director of the United States Patent and Trademark Office*